United States Patent
Johnson et al.

(10) Patent No.: US 7,554,454 B2
(45) Date of Patent: Jun. 30, 2009

(54) APPARATUS AND METHOD FOR SIMULTANEOUSLY DETECTING THE POWER STATE OF A PLURALITY OF CIRCUIT BREAKER SWITCHES

(75) Inventors: Glenn T. Johnson, Oglesby, IL (US); Michael E. Johnson, Oglesby, IL (US)

(73) Assignee: Hi-Tech Electronic Products & Mfg., Inc., Oglesby, IL (US)

( * ) Notice: Subject to any disclaimer, the term of this patent is extended or adjusted under 35 U.S.C. 154(b) by 228 days.

(21) Appl. No.: 11/111,323

(22) Filed: Apr. 21, 2005

(65) Prior Publication Data

US 2006/0238363 A1    Oct. 26, 2006

Related U.S. Application Data

(63) Continuation of application No. PCT/US03/34031, filed on Oct. 24, 2003.

(60) Provisional application No. 60/421,011, filed on Oct. 24, 2002.

(51) Int. Cl.
*G08B 21/00* (2006.01)
*H02H 3/00* (2006.01)
*H01G 9/042* (2006.01)

(52) U.S. Cl. ............... 340/635; 340/638; 340/653; 340/654; 340/657; 340/659; 361/42; 361/529

(58) Field of Classification Search ............ None
See application file for complete search history.

(56) References Cited

U.S. PATENT DOCUMENTS

| | | | | |
|---|---|---|---|---|
| 4,095,212 A * | 6/1978 | Pruitt | .................... | 340/539.16 |
| 4,801,868 A * | 1/1989 | Brooks | ................... | 324/66 |
| 4,906,938 A * | 3/1990 | Konopka | .................. | 324/529 |
| 4,996,646 A * | 2/1991 | Farrington | .................. | 700/293 |
| 5,109,200 A * | 4/1992 | Dushane et al. | ............. | 324/508 |
| 5,422,564 A * | 6/1995 | Earle et al. | ................... | 324/67 |
| 6,163,144 A * | 12/2000 | Steber et al. | .................. | 324/67 |
| 6,212,049 B1 | 4/2001 | Spencer et al. | | |
| 6,392,395 B2 * | 5/2002 | Roberts et al. | ................ | 324/66 |
| 6,456,471 B1 | 9/2002 | Haun et al. | | |
| 7,057,401 B2 * | 6/2006 | Blades | ...................... | 324/713 |
| 7,157,896 B2 * | 1/2007 | Konopka | ..................... | 324/66 |
| 2007/0275595 A1 * | 11/2007 | Hazani et al. | ................ | 439/536 |
| 2008/0094210 A1 * | 4/2008 | Paradiso et al. | ............. | 340/540 |

OTHER PUBLICATIONS

International Search Report dated May 4, 2004 for PCT Application PCT/US03/34031.
Office Action dated Jun. 9, 2008 for Canadian Patent Application No. 2,547,867.

* cited by examiner

*Primary Examiner*—Julie Lieu
(74) *Attorney, Agent, or Firm*—Michael A. Carrillo; Neal, Gerber & Eisenberg LLP (57) ABSTRACT

An apparatus for detecting the power state of a circuit breaker switch is disclosed. The apparatus comprises a detector circuit, a processor and an indicator. The processor is coupled to the detector circuit. The indicator is coupled to the processor. In operation, the detector circuit senses an electronic signal at the circuit breaker switch and transmits a signal to the processor. The processor then transmits a signal to the indicator indicating the power state and location of the circuit breaker switch.

7 Claims, 10 Drawing Sheets

APPARATUS AND METHOD FOR SIMULTANEOUSLY DETECTING THE POWER STATE OF A PLURALITY OF CIRCUIT BREAKER SWITCHES

RELATION TO PRIOR APPLICATION

The present Non-Provisional Patent Application is a continuation of International Application No. PCT/US2003/034031, filed on 24 Oct. 2003, which claims priority to United States Provisional Patent Application No. 60/421,011 filed on 24 Oct. 2002.

FIELD OF THE INVENTION

The present invention relates generally to circuit breaker testing equipment and, more particularly, to a circuit breaker detection circuit disposed proximate to a standard circuit breaker panel, the standard circuit breaker panel having at least one circuit breaker switch contained within the standard circuit breaker panel.

BACKGROUND OF THE INVENTION

In the art it is known to use devices to trace circuit breaker switches that control the power supply to particular electrical outlets. For example, U.S. Pat. No. 5,969,516 (the disclosure of which is herein incorporated by reference in its entirety) discloses an electrical circuit interrupter device locator that is directed to an electronic system for identifying a power line associated with a particular outlet receptacle. This device identifies the particular circuit breaker by imparting a magnetic field on the power line connecting the outlet to a particular circuit breaker. The device also includes a receiver that detects the magnetic field at the corresponding circuit breaker. Additional devices currently in use are described in U.S. Pat. Nos. 6,054,931 and 6,222,358, the disclosures of which are both herein incorporated by reference in their entireties.

While these devices work for their intended purpose, they require the user to sweep the device across each of the circuit breakers until the desired circuit breaker is located. In this regard, the device requires additional time to locate the desired circuit breaker. Thus, the need exists for an apparatus and method for simultaneously detecting the power state of multiple circuit breaker switches. Further, the need exists for such an apparatus to be able to discern the location of outlets associated with a circuit breaker switch.

To solve this problem, it is possible for users to provide a circuit breaker panel that includes a plurality of power indicators corresponding to the number of circuit breakers included in the respective circuit breaker box. Additionally, it is possible to provide implementation to discern the location of outlets associated with a circuit breaker switch.

SUMMARY OF THE INVENTION

In accordance with these needs a system and method are provided for simultaneously displaying the location of, and the power state for, a plurality of circuit breakers. The system is comprised of various printed circuit boards, including, a CPU and a number of individual peak detector circuits positioned next to and corresponding to each of the circuit breakers in a circuit breaker box, and a customized front panel. Moreover, the front panel includes individual LED indicators that correspond to the respective circuit breakers and that are mounted on the front panel in relation to the circuit breakers to which they correspond. Each detector circuit is capable of detecting a signal that is transmitted by a transmitter, which is coupled to a particular outlet, and emitted near each of the corresponding circuit breakers.

A better understanding of the objects, advantages, features, properties and relationships of the invention will be obtained from the following detailed description and accompanying drawings which set forth an illustrative embodiment and which are indicative of the various ways in which the principles of the invention may be employed.

BRIEF DESCRIPTION OF THE DRAWINGS

For a better understanding of the invention, reference may be had to one embodiment, as shown in the following drawings, in which.

DETAILED DESCRIPTION OF THE PRESENTLY-PREFERRED EMBODIMENTS

Referring to the Figures, there is illustrated an apparatus and method for locating, and detecting the state of power, of a plurality of standard and/or currently-known circuit breaker switches. Generally speaking, and with reference to FIG. 1, which illustrates a basic top-level diagram of one embodiment of the present invention, the apparatus of the present invention, also known as detector assembly 10, may comprise printed circuit board 66 and at least one detector circuit 14. Each of the detector circuits 14 is intended to be positioned adjacent to one of the standard circuit breaker switches 22, which, in turn, are disposed in standard and/or currently known circuit breaker box 68. Further, printed circuit board 66 of the detector assembly 10 may include necessary components for effecting the teachings of the present invention, such as, for example, central processing unit (CPU) or processor 16.

Figure 1:
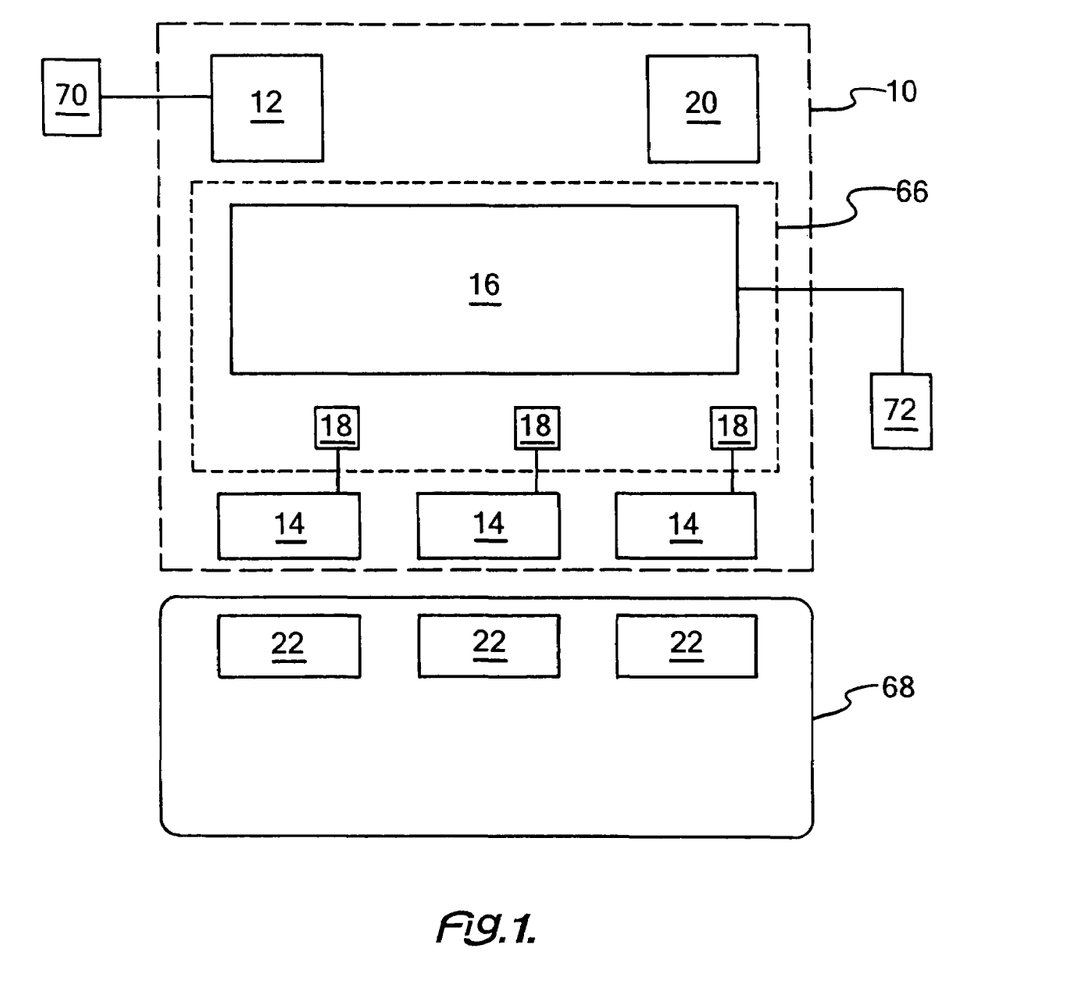
FIG. 1 illustrates a top level diagram of one embodiment of the present invention.

Printed circuit board 66 is preferably enclosed in a plastic housing. As a result, detector assembly 10 is intended to be marketed in a variety of ways. For example, detector assembly 10 may be factory installed by a manufacturer of standard and/or currently known circuit breaker boxes—in which case the printed circuit board would preferably be attached to the metal facing of the circuit breaker box. Additionally, it is contemplated that detector assembly 10 be sold individually, without a circuit breaker box. In this case, detector assembly 10 would be configured and intended to replace the metal facing of the purchaser's existing circuit breaker box, with an emphasis being placed on ease of assembly.

According to the tenets and teachings of the embodiment of detector assembly 10 described herein, it should be noted that at no time is detector circuit 14 electronically attached to circuit breaker box 68 or, conversely, to the individual circuit breaker switches 22 themselves. Due to the construction of most known circuit breaker switches, which comprise an electromagnetic coil that emits an electronic signal (the electronic signal that is sensed by detector circuit 14, further described below), it is only necessary to position detector circuit 14 in close proximity to (but not in electronic connection with) circuit breaker switch 22. Due to the relative weakness of the signal, it may be necessary to place detector circuit 14 on the face of circuit breaker switch 22; however, there will be no electronic connection between detector circuit 14 and circuit breaker switch 22. For safety, security and stability reasons, printed circuit board 66 may be affixed to circuit breaker box 68 through the use of commonly-known methods, such as, for example, screws, nuts/bolts, etc. (this refers to the attachment or replacement of the metal facing of the circuit breaker box, as described above). However, it is also contemplated that the detector assembly 10 may be operated with an electronic connection to circuit breaker switch 22.

It should be noted that, currently, power supply 12 of detector assembly 10 is contemplated to be coupled to electrical outlet 70 disposed proximate to circuit breaker box 68. It should be contemplated that power supply 12 may also be coupled to a power source (not illustrated) disposed within circuit breaker box 68. In such a case, the non-electronic connection of detector circuit 14 to circuit breaker box 68 or circuit breaker switches 22 will nevertheless be maintained. Thus, it should be stressed that, in this embodiment, even if power supply 12 of detector assembly 10 is coupled to a power source within circuit breaker box 68, there is no electronic connection between detector circuit 14 of detector assembly 10 to the circuit breaker box 68 (or any components located therein).

Printed circuit board 66 of detector assembly 10 preferably includes at least one indicator 18. Preferably, indicator 18 may be in the form of a light-emitting diode (LED), although it is contemplated that indicator 18 may comprise any standard and/or currently known indicator capable of providing steady, blinking or dimming lights to a user. Likewise, it is not necessary that indicator 18 be an illumination; rather, indicator 18 may comprise any means of indicating both the location, or the state of power, of a circuit breaker switch. For example, indicator 18 may comprise a liquid crystal display (LCD), an audible signal or the like. For indicating both the location and the state of corresponding circuit breaker switches 22, as defined below, each of the indicators 18 is positioned on a front panel of the detector assembly 10, preferably in close physical proximity to one of the detector circuits 14, which would be disposed in close physical proximity to one of the circuit breaker switches 22.

For exemplary purposes only, the present invention is described herein in relation to a Square D® 200A circuit breaker box, which typically includes thirty circuit breaker switches. In this example, to accommodate the thirty circuit breaker switches in the exemplary circuit breaker box, the present invention would include thirty individual detector circuits, thirty indicators and so on. Further, each of these thirty individual detector circuits would be positioned adjacent to one of the thirty circuit breaker switches.

Given the fact that the description herein concerning the Square D® 200A circuit breaker box is for exemplary purposes only, it should be understood by those having skill in the instant art that the present invention may also be used in connection with other circuit breaker boxes, for example, that contain varying numbers of circuit breaker switches or that operate in connection with different amperage load capacities. Thus, it is to be understood that the present invention will necessarily be adaptable to include a number of individual detector circuits that correspond to the number of circuit breaker switches included within the circuit breaker box.

Further, those having skill in the art should appreciate that the electronic signals emitted by the individual circuit breaker switches 22 may be electromagnetic fields or pulses, current spikes or other signals capable of being sensed by the individual detector circuits 14. For example, in one embodiment, a transmitter/receiver device 72 may be configured to create a current spike. This current spike, which takes the form of an electronic signal, would then be transmitted to all circuit breaker switches 22 within circuit breaker box 68. When activated, detector circuit 14 would detect which circuit breaker switch 22 emits the strongest electronic signal (i.e., the current spike). Indicator 18 located proximate to and corresponding to that circuit breaker switch 22 would then be activated, indicating that a strong electronic signal has been detected. In doing so, indicator 18 would also indicate that a particular outlet is being controlled by circuit breaker switch 22 adjacent to indicator 18.

Each detector circuit 14 preferably is adapted to detect electromagnetic pulses which are emitted from the circuit breaker switch 22 disposed nearest to detector circuit 14. These electromagnetic pulses may preferably originate from a pulse- (or spike-) generating transmitter/receiver device 72 coupled to an outlet. In this way, detector assembly 10 acts as a testing mechanism, testing individual circuit breaker switches 22. Transmitter/receiver device 72 is able to generate a signal which will be sensed by detector circuit 14 of detector assembly 10, indicating which individual circuit breaker switch 22 correlates to the specific outlet in which transmitter/receiver device 72 is coupled. Transmitter/receiver device 72 may also possess a means to display (digitally or otherwise) identifying information for individual circuit breaker switches 22, such as, for example, a number corresponding to the placement of the individual circuit breaker switch 22 within circuit breaker box 68. It should also be appreciated by those having skill in the art that transmitter/receiver device 72 possesses standard and/or currently-known electronic channels of communication between the components of the present invention and transmitter/receiver device 72, such as, for example, via radio frequency, electrical wiring or similar means.

Alternatively, detector assembly 10 may be used in "real time;" that is, detector assembly 10 may be used to determine the state of power of circuit breaker switch 22 during that circuit breaker switch's normal operation.

The overall design of detector assembly 10 is meant to be both simple in placement and adaptable for a variety of uses. To this end, the description that follows concerning a more specific and detailed illustration of the elements of detector assembly 10 is exemplary in nature and should not be construed to be exhaustive.

Referring again to FIG. 1, detector assembly 10 is illustrated as comprising power supply 12, detector circuit 14, processor 16, indicator 18 and dead circuit detector 20. Detector assembly 10 is further illustrated as being in close proximity to circuit breaker switch 22, which represents any standard and/or currently-known circuit breaker switch. Although not illustrated, it should nevertheless be understood that circuit breaker switch 22 is disposed within any standard and/or currently-known circuit breaker box.

Figure 2:
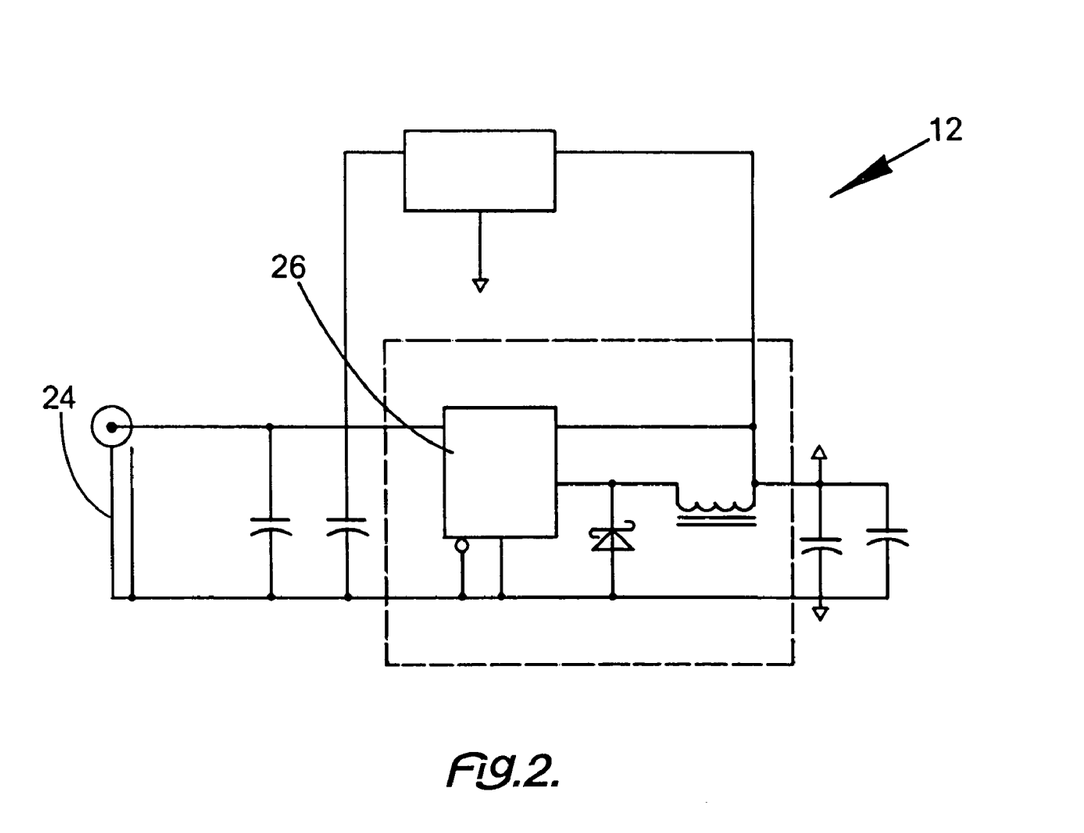
FIG. 2 illustrates a schematic diagram of a power supply, in accordance with the embodiment of the present invention illustrated in FIG. 1.

To provide power to detector assembly 10, power supply 12 preferably comprises any standard and/or any currently-known supply of direct current (DC) Voltage (VDC) to detector assembly 10. Reference is made to FIG. 2, which illustrates a schematic diagram of an exemplary embodiment of power supply 12 of the present invention. For exemplary purposes only, power supply 12 comprises a 12 VDC, 500 ma wall brick connected to a J3 (2.1 mm) power jack (illustrated in FIG. 2 as reference numeral 24). Additionally, power supply 12 preferably includes voltage regulator 26, which regulates the supply of DC Voltage through detector assembly 10. Again, for exemplary purposes only, it is contemplated that the present invention will utilize an LM340s-5 linear voltage regulator, or any other similar voltage regulator capable of supplying +5 VDC to the entire circuitry of detector assembly 10.

Figure 3:
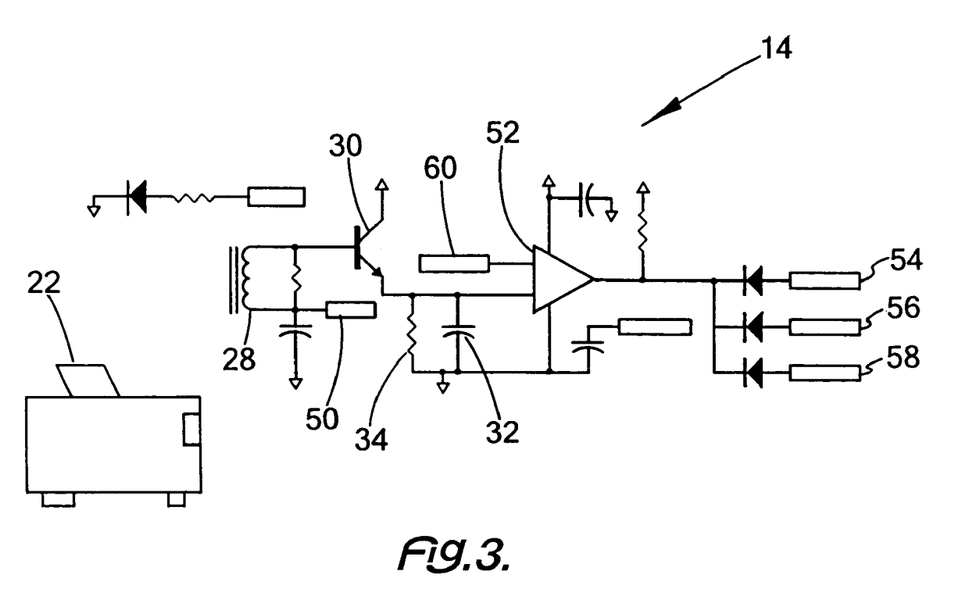
FIG. 3 illustrates a schematic diagram of a detector circuit, in accordance with the embodiment of the present invention illustrated in FIG. 1.

To most accurately and efficiently perform the detection processes necessary to determine the power state for a circuit breaker, detector circuit 14 is disposed in a region adjacent to circuit breaker switch 22. Preferably, detector circuit 14, of which one embodiment of a schematic is illustrated in FIG. 3, comprises inductor 28, transistor 30, first capacitor 32, first resistor 34, second resistor 36, first diode 38, second diode 40, second capacitor 42, operational amplifier 44, third capacitor 46 and fourth capacitor 48. In operation, inductor 28, which—for exemplary purposes only—is a L1-30 inductor, senses an electronic signal from circuit breaker switch 22. Preferably, the electronic signal emitted from circuit breaker switch 22 will range between 1-3 VDC; thus, it is preferable that inductor 28 be sensitive enough to sense such a signal range. Additionally, inductor 28 should be able to sense both lower and higher signal ranges.

Upon sensing the electronic signal by inductor 28, the electronic signal is then amplified by transistor 30. After passing through transistor 30, which preferably is a model 2N3904 transistor, the amplified signal is stored in first capacitor 32. For exemplary purposes only, first capacitor 32 comprises a 0.0047 μF/50 V capacitor. Preferably, detector circuit 14 is configured such that the storage of the amplified signal in first capacitor 32 only relates to the most recent signal. Thus, detector circuit 14 further comprises first resistor 34, preferably of a value of 1M Ohms, to discharge any voltage previously stored in first capacitor 32.

Figure 4:
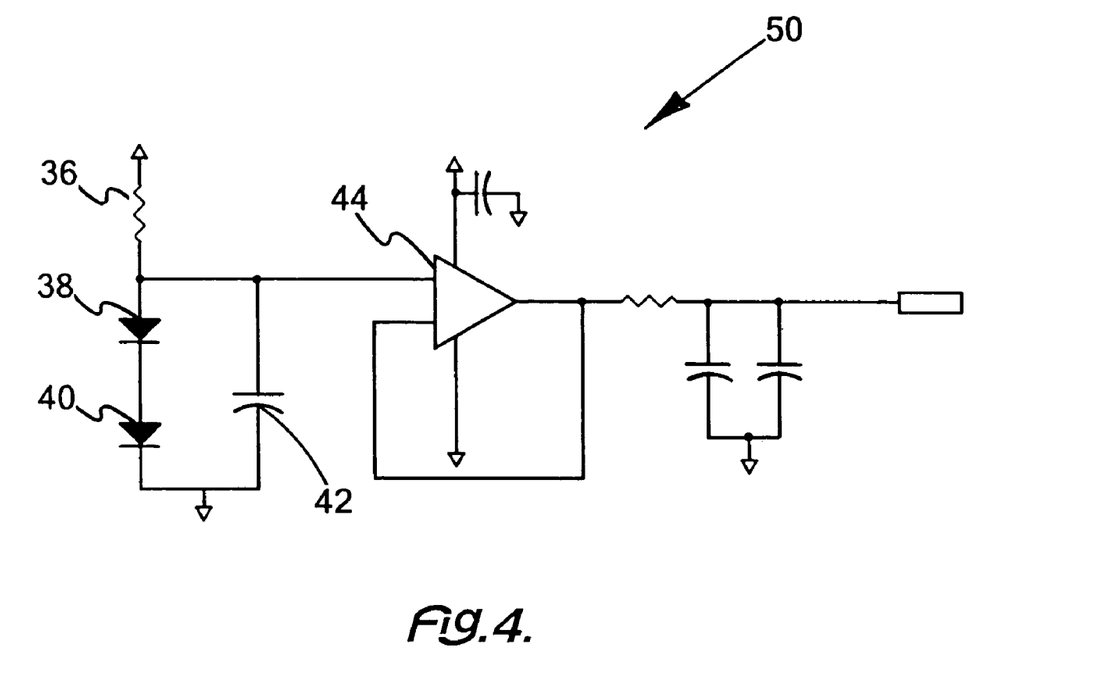
FIG. 4 illustrates a schematic diagram of a bias voltage circuit, in accordance with the embodiment of the present invention illustrated in FIG. 1.

A bias voltage may also be provided to detector circuit 14. Bias voltage circuit, which is illustrated in FIG. 3 by reference numeral 50, is more accurately shown in FIG. 4. Referring to FIG. 4, second resistor 36, first diode 38, second diode 40 and second capacitor 42 serve to provide a bias voltage, which is then provided to detector circuit 14. This bias voltage is preferably buffered through operational amplifier ("op amp") 44 for the DC level of inductor 28. This buffering process ensures that even the smallest signal will be amplified by transistor 30. It should be appreciated that other designs and combinations of discrete components may also be employed to provide similar functions as provided by the bias voltage circuit, the op amp 44, etc.

Returning to FIG. 3, to add stability to detector circuit 14, third capacitor 44 and fourth capacitor 46 are included. Preferably, third capacitor 44 and fourth capacitor 46 are 0.1 μF capacitors. Additionally included in detector circuit 14 is comparator 52. For exemplary purposes only, comparator 52 preferably comprises an LM339 model comparator. As a default value, comparator 52 is normally in "high" mode. When a peak level has been detected by detector circuit 14 and transmitted to comparator 52, comparator 52 switches to "low" mode. At this point, comparator 52 generates a unique identification code. This unique identification code is preferably generated by biasing three transistors through third diode 54, fourth diode 56 and fifth diode 58. These three diodes 54, 56, 58 are tied to the output of comparator 52, while the three transistors are tied to processor 16, and allow processor 16 to identify the particular circuit breaker and adjust the sensitivity of comparator 48.

Figure 5:
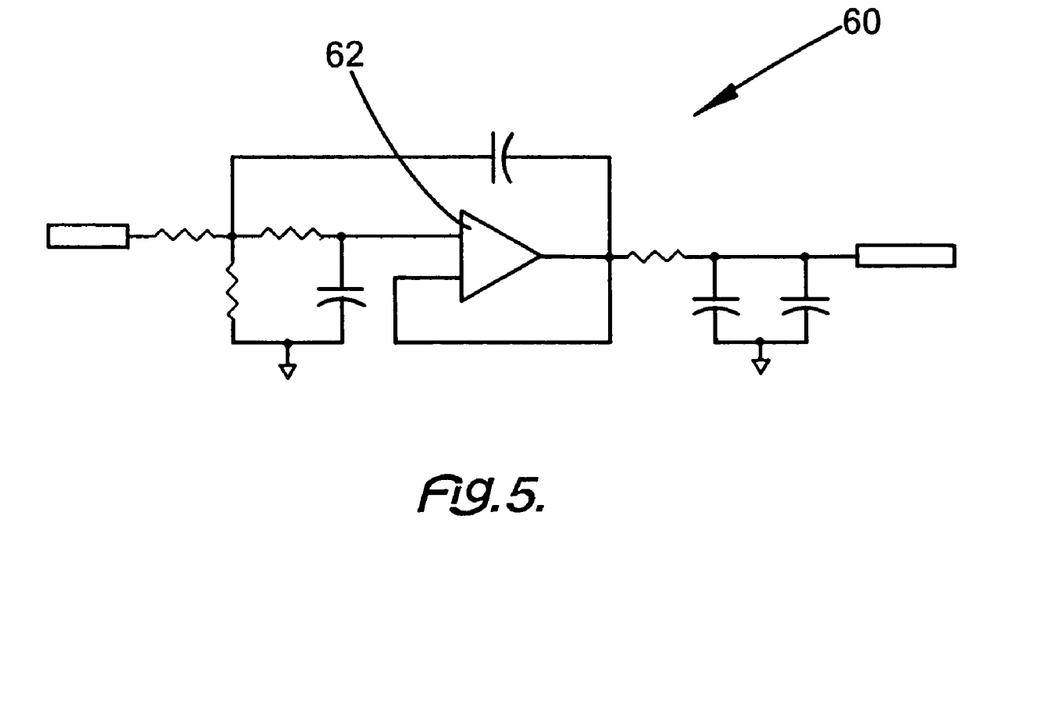
FIG. 5 illustrates a schematic diagram of a voltage comparison circuit, in accordance with the embodiment of the present invention illustrated in FIG. 1.

Comparator 52 preferably compares the stored peak voltage, which has been detected by detector circuit 14 and transmitted to comparator 52, with a voltage generated by comparator circuit 60. Comparator circuit 60 is most clearly illustrated by FIG. 5. Referring to FIG. 5, the generated voltage is demonstrated as coming from a pulse width modulated (PWM) signal. This PWM signal is generated from processor 16, and is transmitted through low pass filter 62. The PWM signal is varied, allowing the comparison of many different levels.

Figure 6:
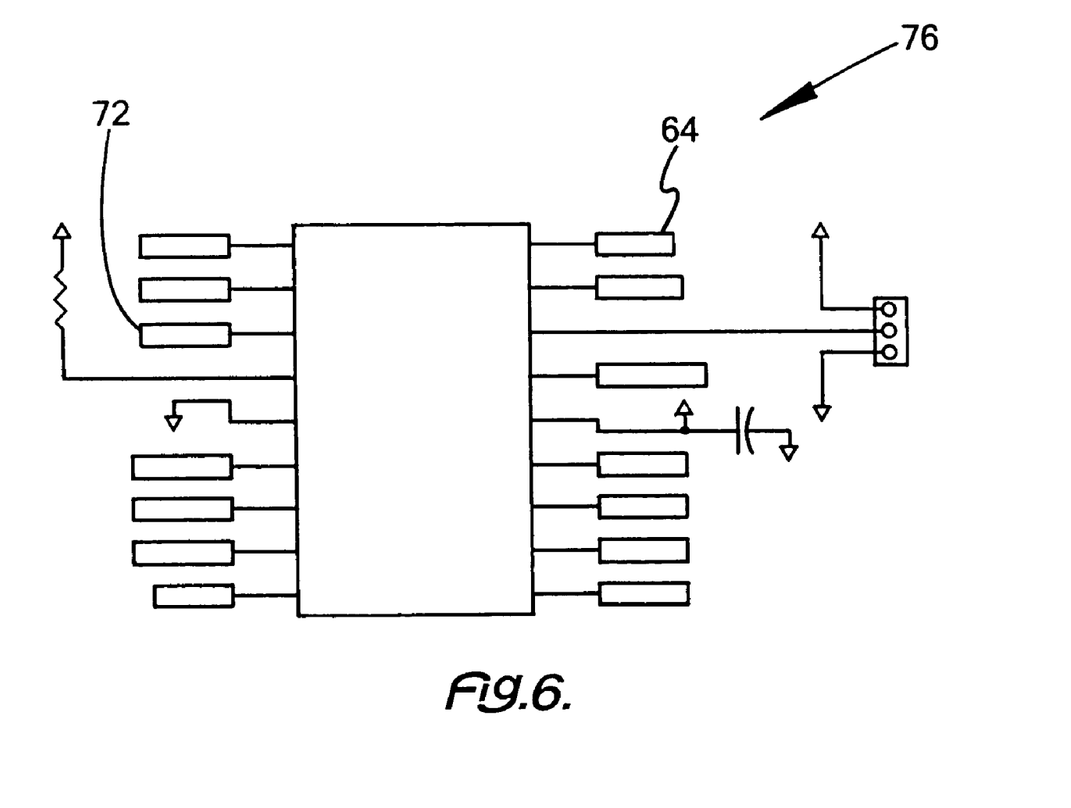
FIG. 6 illustrates a schematic diagram of a processor, in accordance with the embodiment of the present invention illustrated in FIG. 1.

For controlling the operations of detector assembly 10, processor 16 is provided. Illustrated in FIG. 6, processor 16 preferably comprises any standard and/or currently-known processor which can be adapted to control the operations of the present invention. For example, as illustrated in FIG. 6, and for exemplary purposes only, processor 16 is a PIC16F627-04/SO microchip processor from Microchip Technology. It is nevertheless contemplated that any alternative processor may be utilized within the confines of the present invention. Preferably, processor 16 controls the operations of detector circuit 14, indicator 18, dead circuit detector 20, comparator circuit 60, low pass filter 62 and all other operations of detector assembly 10.

Referring again to FIG. 3, when an electronic signal is sensed from circuit breaker switch 22, a signal is transmitted from detector circuit 14 to processor 16 indicating the sensing of the electronic signal at circuit breaker switch 22. After receiving the signal from detector circuit 14, processor 16 then preferably transmits a signal to indicator 18. Preferably, indicator 18 comprises any standard and/or currently known LED or similar indicating device. The signal to indicator 18 preferably instructs indicator 18 to light up, or otherwise indicate the state of circuit breaker switch 22. Additionally, a signal may be transmitted from processor 16 instructing indicator 18 to indicate that a transmitter peak has been detected. In situations in which indicator 18 is instructed to indicate that circuit breaker switch 22 is "ON," indicator 18 will preferably be continuously illuminated. In situations in which indicator 18 is instructed to indicate that a transmitter peak has been detected, indicator 18 will preferably flash as long as transmitter/receiver device 72 is connected to the corresponding outlet. Nevertheless, it is generally contemplated that indicator 18 will indicate the power status or location of circuit breaker switch 22 using any set of predetermined signals.

Record, Playback, and Reset buttons are tied to two ports on the CPU. Record and Playback LEDs are each current limited by a 300 ohm resistor and they are tied to the two ports on the CPU.

Figure 7:
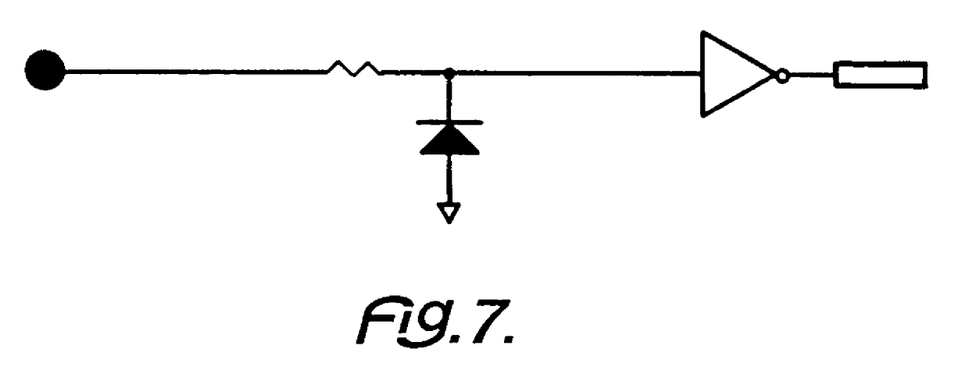
FIG. 7 illustrates a schematic diagram of a dead circuit detector, in accordance with the embodiment of the present invention illustrated in FIG. 1.
Figure 8:
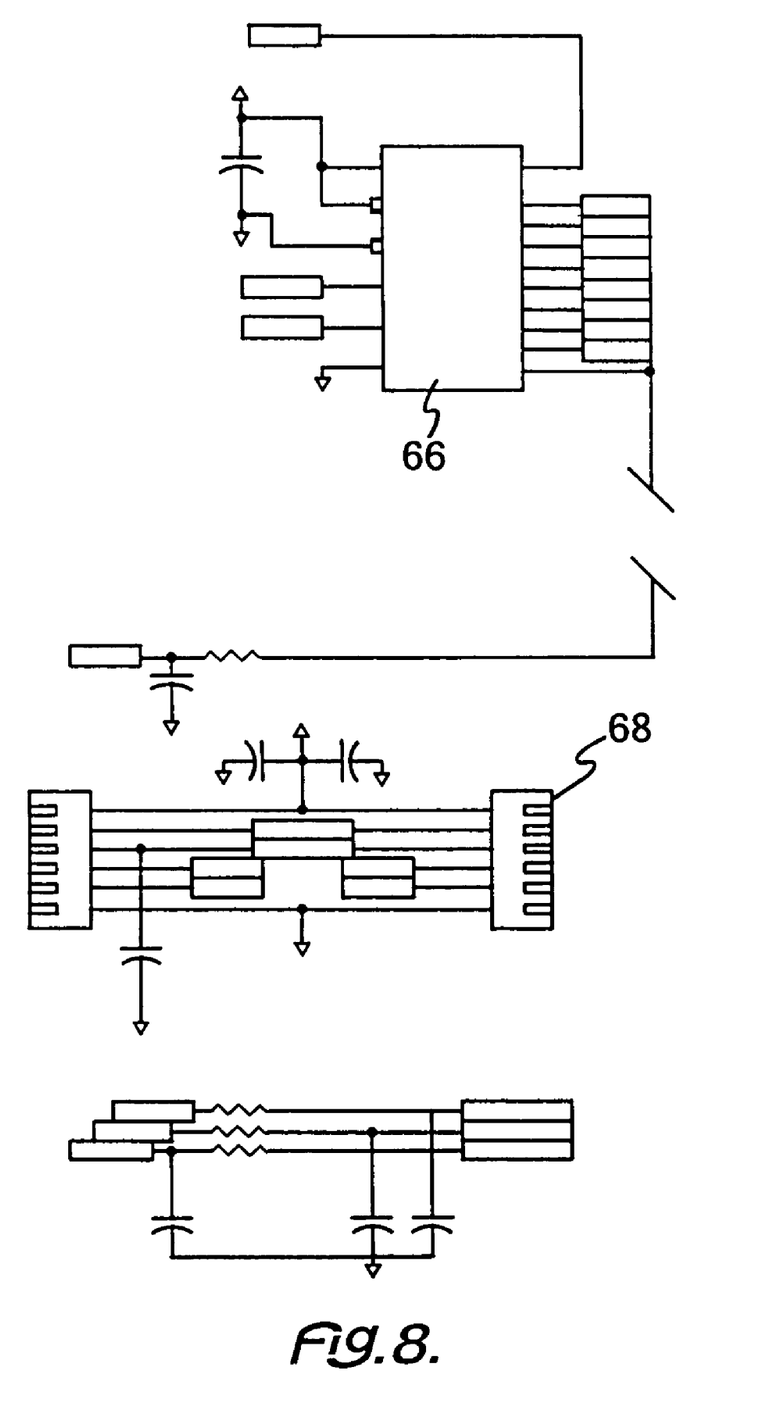
FIG. 8 illustrates a schematic diagram of a dead circuit, in accordance with the embodiment of the present invention illustrated in FIG. 1.

Detector assembly 10 may also include dead circuit detector 20. An exemplary illustration of dead circuit detector 20 is shown in FIG. 7. To accommodate the inclusion of dead circuit detector 20, an additional provision has been made available on processor 16. Referring to FIG. 6, dead circuit detector pin 64 is coupled to dead circuit controller 66. Dead circuit controller 66 is most clearly illustrated in FIG. 8. The output of dead circuit controller 66 is inputted to dead circuit connector 68, along with +5VDC, ground, latch and clock signals. This output is then clocked through dead circuit daughter board controller 70 and fed to processor 16 at pin 72.

Referring to FIG. 7, each dead circuit detector 20 includes multiple 0.400" unmasked pads 74, each placed close to the open switch contact of a circuit breaker used as a pickup for alternating voltages. The pickup is then fed through a 10 Mega-ohm current limiting resistor 76 into the gate of inverter 78. The output of inverter 78 is tied to the input of dead circuit daughter board controller 70, and, eventually, to processor 16. When the breaker is in the "ON" position, the corresponding LED will be turned on dimly but continuously. When the breaker is in the "OFF" position, the LED will be off. When a breaker was "ON" immediately after a system reset, and then is later detected to be off, the corresponding LED will flash with a quick cadence, distinct from the slower flash indicating peak detection. Pressing the Reset button while not in Playback or Record mode will force the CPU to perform a system reset.

Figure 9:
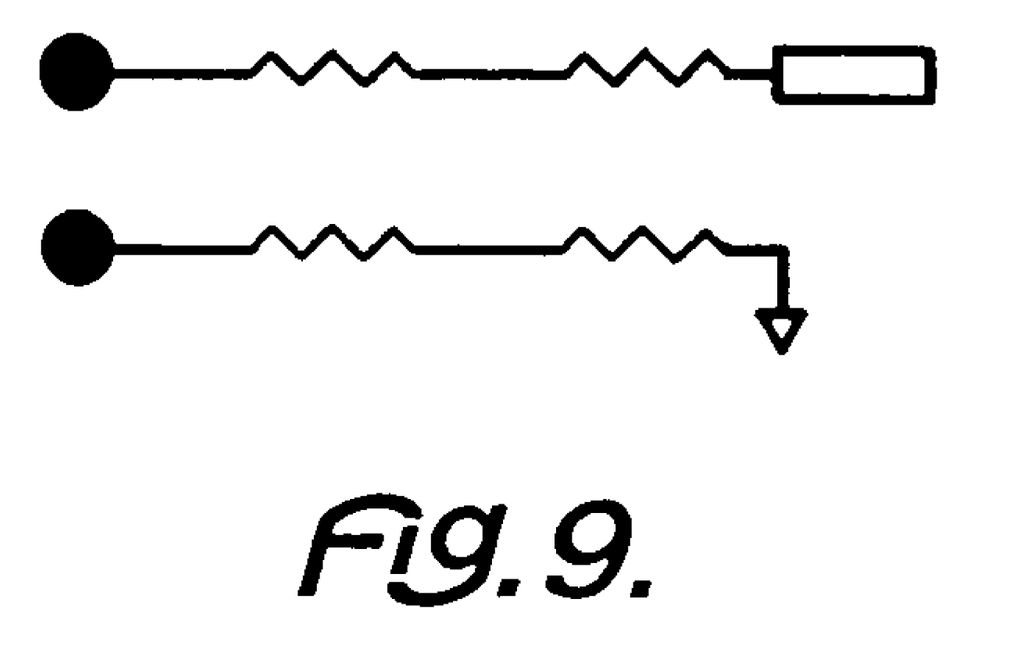
FIG. 9 illustrates a schematic diagram of a transmitter/receiver device, in accordance with the embodiment of the present invention illustrated in FIG. 1.
Figure 10:
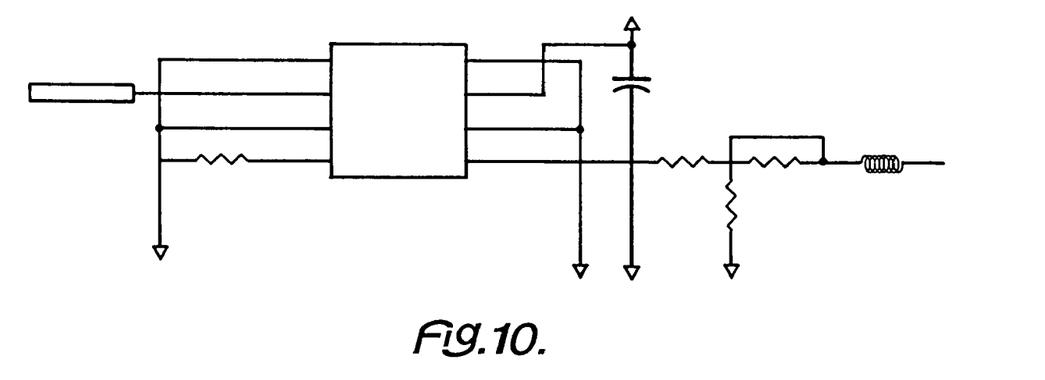
FIG. 10 illustrates a transmitter circuit of the transmitter/receiver device illustrated in FIG. 9.

FIG. 9 illustrates a schematic diagram for the transmitter/receiver device. The transmitter/receiver device is the device which, when coupled to an outlet, generates the electronic signal which is sensed by detector assembly 10. FIG. 9 illustrates the two independent circuits that are built into the transmitter/receiver device. The first circuit superimposes a signal on the AC line between the outlet and the circuit breaker switch. This signal, which is transmitted to the circuit breaker box, is sensed by the detector assembly. It should be noted that the present invention contemplates the transmission of the signal to the circuit breaker box to transmitter/receiver device 72 through any standard means of transmission, such as, for example, RF, X10, Wi-Fi, etc. At that point, the processor then uses the presence of the signal to determine the circuit breaker switch associated with the outlet. The processor then uses the transmitter circuit (FIG. 10) to relay the number associated with the circuit breaker switch to the display located on the transmitter/receiver. The second circuit in FIG. 9 receives the signal from the processor indicating the number associated with the circuit breaker switch and converts the signal to a digital format for display.

With the completion of the above description concerning the various elements of the present invention, the following description will focus on the operation of the present invention, that is, a method for simultaneously detecting the power state and location for a plurality of circuit breaker switches. Generally speaking, processor 16 controls the operation of detector assembly 10. That is, processor 16 controls the operation of, inter alia, power supply 12, detector circuit 14 and LED 62, as well as all ancillary functions thereof.

As stated above, preferably stored within processor 16 is software that controls the operation of the above-mentioned elements. Preferably, this software is permanently stored within processor 16 in any currently-known memory location, such as, for example, a Read Only Memory location. However, it should also be appreciated that the software may also be stored in a non-static format, such as, for example, Random Access Memory. A microchip, preferably located within processor 16, possesses the ability to access and run the software.

Generally speaking, during standard operation, the software reads the output of all circuits every few milliseconds. If a live circuit is detected, the corresponding indicator will preferably turn on dimly until no reading is detected from that live circuit after a predetermined number of consecutive readings. In the preferred embodiment of the present invention, this reading occurs every 1.8 milliseconds and, furthermore, twenty consecutive "OFF" reads are made before the unit is indeed determined to be "OFF."

When the panel is first powered up, or upon reset of the system, processor 16 will preferably take an inventory of the breakers installed at the time. In taking this inventory, processor 16 will store into memory the location of all circuit breaker switches 22 that are determined to be "ON." If one of the circuit breaker switches 22 is later determined to be "OFF," the corresponding indicator will flash quickly, alerting the user to the tripped breaker. It should be noted that this flashing sequence is distinctly different than the peak detector flashing sequence. Correspondingly, all circuit breaker switches 22 that are determined to be "OFF" will have their corresponding indicators flashing quickly; this includes all dead (or blown) circuit breaker switches 22, and all breaker positions having no circuit breaker switch 22. Finally, all located breakers using the transmitter module to locate the breaker associated with the wall outlet being tested will blink, simulating that of a heart beat.

The unit has several peak detectors circuits, each of which compares the detected signal with a common threshold voltage generated by the main CPU as a reference voltage. If one of the peak detector circuits detects a signal, it will pull down a unique combination of three of the eight "detect" wires going to the common circuitry. This circuitry will invert and capacitor-latch the eight signals. The CPU will read and reset these signals every few milliseconds.

If exactly three of the wires were pulled down (i.e. they're pulled up at the CPU), the circuit will cause the LED corresponding to that combination of wires to blink. If more than three wires are pulled, this indicates that the circuit is too sensitive (since more than one circuit is reporting) and the CPU will respond by increasing the common threshold voltage. If there are not at least three wires pulled down, this indicates that the unit may be insufficiently sensitive so it will increase sensitivity (up to a certain limit) by reducing the common threshold voltage.

The user can optionally record the sequence of circuit breakers that were tested. When the Record button is depressed, the CPU will clear all previously stored data and store the sequence in which the circuit breakers are detected to memory, which can be played back after the user has inserted the transmitter into all the circuits being tested. Pressing Playback once will flash the first circuit breaker's LED that corresponded to the first tested outlet. Pressing the Playback button again will stop the first LED from flashing and flash an LED corresponding to the second tested outlet. The Reset button can then be depressed to end the Playback sequence or record sequence.

The process for locating a breaker or mapping the entire house is fairly simple. A user simply proceeds to each wall outlet after initializing the system (the "Record" sequence). The user will then insert the transmitter/receiver device into each outlet for a predetermined period of time, such as, for example, about one or two seconds. At this point, the user may wish to write the physical location of the outlet on paper. The user then proceeds to document all the outlets in the building in this same manner. When finished, the user returns to the circuit breaker box. The user then initiates a sequence for indicating which outlet is associated with which circuit breaker switch (the "Playback" sequence). During this sequence, the indicator will blink, indicating the first outlet location that the transmitter/receiver was plugged into. Assuming the user kept the log, as described above, the user would then write the circuit breaker switch number next to the physical location. This process is also repeated until all circuit breaker switches are identified. Upon the completion of this process, the system will reset itself and continue to monitor the status of the breakers.

Please note that if the user is interrupted during either the Playback or Record sequences, the system will reset itself and return to normal operation. If the user then wants to resume mapping, the user simply has to reinitiate the Playback sequence, and the system will revert to the first location.

While specific embodiments of the present invention have been described in detail, it will be appreciated by those skilled in the art that various modifications and alternatives to those details could be developed in light of the overall teachings of the disclosure. For example, many of the independent circuits could be combined within a single microprocessor or various combinations of discrete components could be provided to provide similar functions. Additionally, it is understood that the present invention may encompass various aspects and elements, described above, while not including others. Accordingly, it will be understood that the particular arrangements and procedures disclosed are meant to be illustrative only and not limiting as to the scope of the invention, which is to be given the full breadth of the appended claims and any equivalents thereof.

What is claimed is:

1. A system for detecting the location of at least one circuit breaker switch amongst a plurality of circuit breaker switches disposed within a circuit breaker box and associated with a plurality of electrical circuits each having at least one electrical receptacle, the system comprising:
a detection assembly including a processor and a plurality of detector circuits each having an associated sensor in communication with the processor;
the detection assembly mountable in relation to the circuit breaker box such that the sensor of each of the detector circuits is disposed adjacent to and independently associated with one of the circuit breaker switches; and
a transceiver capable of:
being plugged into the electrical receptacle of one of the plurality of electrical circuits;
transmitting a predetermined signal through one of the plurality of circuit breaker switches associated with the electrical circuit having the electrical receptacle into which the transceiver is plugged; and
receiving an indicator signal caused to be generated by the detector circuit adjacent the circuit breaker switch associated with the electrical circuit having the electrical receptacle into which the transceiver is plugged;
the indicator signal indicating the one of the plurality of circuit breaker switches associated with the electrical circuit having the electrical receptacle into which the transceiver is plugged.

2. The system of claim 1, wherein the processor is configured to record and replay a mapping sequence of the location of each of the plurality of circuit breaker switches associated with each of the electrical receptacles of the electrical circuits within which the transceiver is plugged in a sequence.

3. A display panel mounted in a circuit breaker box for detecting the location of at least one circuit breaker switch amongst a plurality of circuit breaker switches disposed within a circuit breaker box and associated with a plurality of electrical circuits, the display panel comprising:
a circuit board including a processor, a memory, and an indicator;
a power source coupled to the circuit board;
a detector circuit coupled to the circuit board, the detector circuit including a sensor disposed in close proximity to one of the plurality of circuit breaker switches;
wherein the sensor of the detector circuit is capable of sensing a test signal transmitted within the electrical circuit associated with the circuit breaker switch; and
wherein the processor and the memory are configured to record and replay a mapping sequence of the plurality of circuit breaker switches associated with each of the plurality of electrical circuits within which the test signal is transmitted.

4. The display panel of claim 3, further comprising
a dead circuit detector coupled to the circuit board, wherein the dead circuit detector determines the level of activity within the electrical circuit associated with the circuit breaker switch.

5. A method for detecting the location of a circuit breaker switch associated with a particular electrical circuit having a transceiver plugged into an electrical receptacle, the method comprising the steps of:
mounting a sensor of a detector circuit in close proximity to the circuit breaker switch;
transmitting a test signal from the transceiver through the electrical circuit;
sensing the test signal at the sensor;
transmitting an indicator signal from the detector circuit to the transceiver indicating the location of the circuit breaker switch associated with the particular electrical circuit having the electrical receptacle into which the transceiver is plugged.

6. A detector assembly for detecting the location of at least one circuit breaker switch amongst a plurality of circuit breaker switches disposed within a circuit breaker box and associated with a plurality of electrical circuits, the assembly comprising:
a processor and an associated memory;
a plurality of detector circuits each having an associated sensor in communication with the processor;
a plurality of indicators in communication with the processor and each associated with one of the detector circuits;
the assembly mountable in relation to the circuit breaker box such that the sensor of each of the detector circuits is disposed adjacent to and independently associated with one of the circuit breaker switches;
the processor capable of activating the indicator associated with each of the detector circuits that detects a predetermined signal transmitted through the adjacent associated circuit breaker switch, the processor programmed with a recording function to allow recording of a testing sequence within the associated memory.

7. The detector assembly of claim 6, further comprising
a dead circuit detector in communication with the processor, wherein the dead circuit detector determines the level of activity within the electrical circuit associated with the adjacent associated circuit breaker switch.

* * * * *